United States Patent
Reitsma

(10) Patent No.: US 9,088,261 B2
(45) Date of Patent: Jul. 21, 2015

(54) RESONANT IMPEDANCE SENSING BASED ON CONTROLLED NEGATIVE IMPEDANCE

(71) Applicant: Texas Instruments Incorporated, Dallas, TX (US)

(72) Inventor: George P. Reitsma, Redwood City, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/186,942

(22) Filed: Feb. 21, 2014

(65) Prior Publication Data
US 2014/0247090 A1     Sep. 4, 2014

Related U.S. Application Data

(60) Provisional application No. 61/772,290, filed on Mar. 4, 2013, provisional application No. 61/772,324, filed on Mar. 4, 2013, provisional application No. 61/838,084, filed on Jun. 21, 2013, provisional application No. 61/877,759, filed on Sep. 13, 2013.

(51) Int. Cl.
*H03B 7/06*     (2006.01)
*H03H 2/00*     (2006.01)
*G01D 5/20*     (2006.01)

(52) U.S. Cl.
CPC .............. *H03H 2/005* (2013.01); *G01D 5/202* (2013.01)

(58) Field of Classification Search
USPC ......... 327/568, 498, 169, 192, 195, 196, 326, 327/397, 402; 331/115, 132; 333/213, 214, 333/216, 217
See application file for complete search history.

(56) References Cited

U.S. PATENT DOCUMENTS 3,555,534 A    1/1971   Akers et al.
4,310,807 A *   1/1982   McKee ........................ 331/65
(Continued)

FOREIGN PATENT DOCUMENTS

| DE | 10054288 | 5/2002 |
|---|---|---|
| DE | 10013554 | 8/2007 |
| DE | 20122788 U1 | 12/2007 |
| DE | 102009052467 B3 | 7/2011 |
| DE | 102010017798 A1 | 1/2012 |
| EP | 0159089 A1 | 10/1985 |
| SU | 1420564 | 8/1988 |

OTHER PUBLICATIONS

PCT Search Report mailed Mar. 4, 2014.
(Thoss, et al.) "A Novel Architecture for Inductive Proximity Sensors Using Sigma Delta Modulation," IEEE 2007, pp. 284-287.

*Primary Examiner* — Lincoln Donovan
*Assistant Examiner* — Thomas Skibinski
(74) *Attorney, Agent, or Firm* — Andrew Viger; Frank D. Cimino

(57) ABSTRACT

Resonant impedance sensing with a resonant sensor (such as LC) is based on generating a controlled negative impedance to maintain steady-state oscillation in response to changes in resonance state caused by interaction with a target. Resonant impedance sensing can include: (a) generating a controlled negative impedance at the sensor; (b) controlling the negative impedance based on a detected resonance state to substantially cancel the sensor resonant impedance, such that the sensor resonance state corresponds to steady-state oscillation, where the negative impedance is controlled by a negative impedance control loop that includes the sensor resonator as a loop filter; and (c) providing sensor response data based on the controlled negative impedance, such that the sensor response data represents a response of the sensor to the target. Thus, the response of the sensor to the target corresponds to the negative impedance required for steady-state oscillation.

11 Claims, 7 Drawing Sheets

(56) References Cited

U.S. PATENT DOCUMENTS

| | | |
|---|---|---|
| 7,847,539 B2 | 12/2010 | Machul et al. |
| 8,432,169 B2 * | 4/2013 | Niwa et al. ............... 324/652 |
| 2003/0071638 A1 * | 4/2003 | Machul .................... 324/654 |
| 2009/0133496 A1 | 5/2009 | Kanai et al. |
| 2009/0267596 A1 | 10/2009 | Wang et al. |
| 2010/0148799 A1 | 6/2010 | Hardie |
| 2014/0247040 A1 * | 9/2014 | Reitsma et al. ......... 324/207.15 |

* cited by examiner

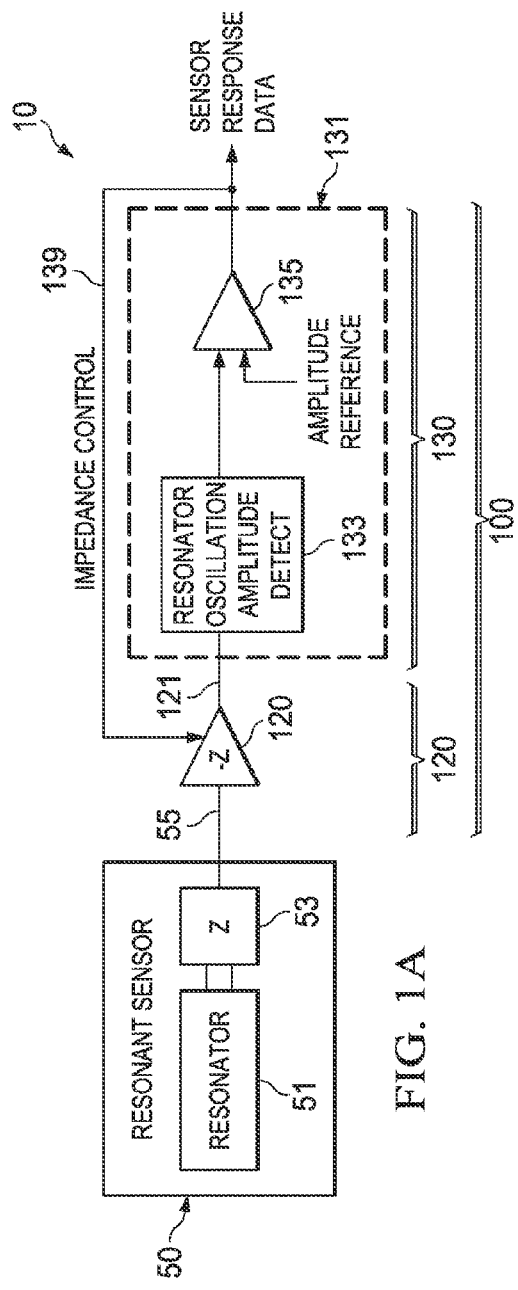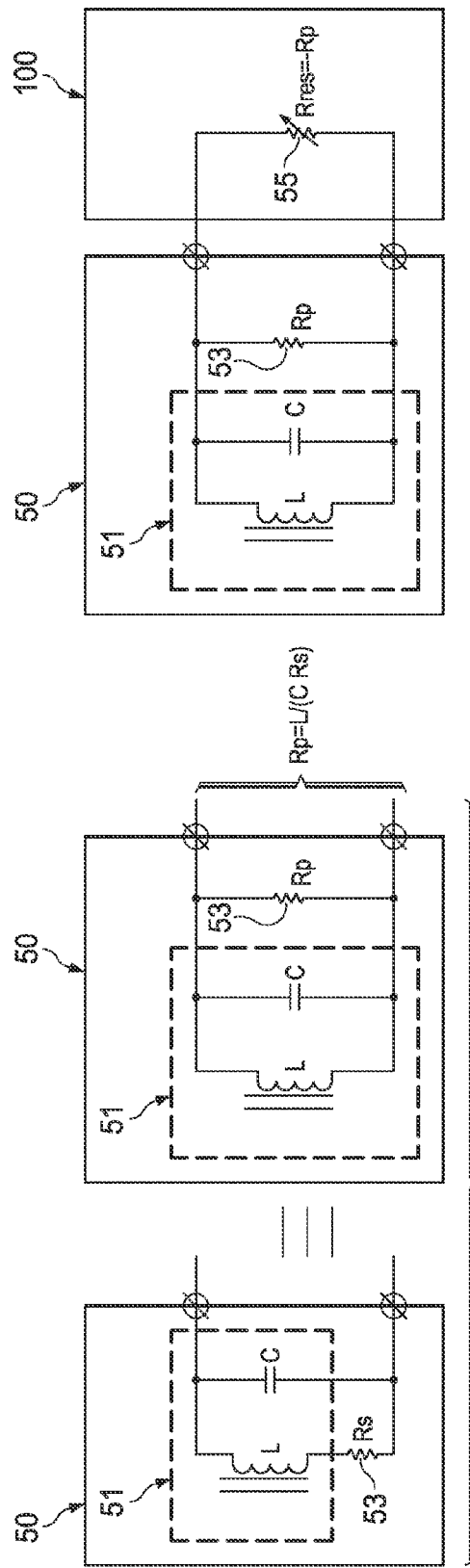

RESONANT IMPEDANCE SENSING BASED ON CONTROLLED NEGATIVE IMPEDANCE

CROSS REFERENCE TO RELATED APPLICATIONS

Priority is claimed under USC §119(e) to U.S. Provisional Application 61/772,290 filed Mar. 4, 2013 (Texas Instruments TI-73510P); 61/772,324 filed Mar. 4, 2013 (Texas Instruments TI-73551P); 61/838,084 filed Jun. 21, 2013 (Texas Instruments TI-73941P); and 61/877,759 filed Sep. 13, 2013 (Texas Instruments TI-73551P1).

BACKGROUND

1. Technical Field

This Patent Document relates generally to sensors and sensing, such as may be used in measuring or detecting the response of a sensor to a target, for example, based on position, proximity or physical state or condition.

2. Related Art

A resonant sensor includes a resonator configured for steady-state (non-sensing) operation at a resonant frequency and amplitude. Resonant sensing is based on changes in sensor resonance_state as manifested by, for example, changes in resonator oscillation amplitude and frequency resulting from changes in sensor/resonator resonant impedance in response to a target. Sensor response to a target can be caused, for example, by proximity or position of the target relative to the sensor, or some sensed physical state of the target.

For example, in case of inductive sensing, sensor (resonator) impedance is affected by a storage or loss in magnetic flux energy output from the inductive sensing coil of an LC resonator, such as may be caused by the eddy current effect associated with a conductive target. In case of a sensor with a resonator based on a variable capacitor, resonator impedance is affected by the storage or loss of electric field energy. In case of a piezo-electric resonator, sensor resonance is affected by a change in mechanical stress on the piezo-crystal.

While this Background information is presented in the context of sensor applications, the utility of the Disclosure is not limited to such applications, but is more generally directed to a methodology for measuring changes in sensor/resonator resonant impedance in response to a target.

BRIEF SUMMARY

This Brief Summary is provided as a general introduction to the Disclosure provided by the Detailed Description and Figures, summarizing some aspects of the disclosed invention. It is not a detailed overview of the Disclosure, and should not be interpreted as identifying key elements of the invention, or otherwise characterizing the scope of the invention disclosed in this Patent Document.

The Disclosure describes apparatus and methods for resonant impedance sensing using a resonant sensor that includes a resonator characterized by a resonant impedance and resonant frequency, and a resonance state that corresponds to resonator oscillation amplitude and resonator frequency, including a resonance state corresponding to steady-state oscillation (steady-state resonance), where both resonant impedance and resonance state change in response to the target.

Various embodiments of a resonant impedance sensing methodology according to the Disclosure can include: (a) generating a controlled negative impedance which is presented to the sensor; (b) controlling the negative impedance based on a detected resonance state to substantially cancel the sensor resonant impedance, such that the sensor resonance state corresponds to steady-state oscillation, where the negative impedance is controlled by a negative impedance control loop that includes the sensor resonator as a loop filter; and (c) providing sensor response data based on the controlled negative impedance, such that the sensor response data represents a response of the sensor to the target.

An embodiment of an apparatus configured to implement the resonance impedance sensing methodology according to the Disclosure can include: (a) negative impedance circuitry configured to couple to the sensor, and configured to present to the sensor a negative impedance controlled in response to a negative impedance control signal; and (b) impedance control circuitry configured to generate the negative impedance control signal based on a detected sensor resonance state, such that the controlled negative impedance substantially cancels the sensor resonant impedance so that the sensor resonance state corresponds to steady-state oscillation. A negative impedance control loop includes the sensor resonator as a loop filter, and controls negative impedance such that the negative impedance control signal corresponds to sensor response data that represents the response of the sensor to the target.

Other aspects, features and advantages of the invention will be apparent to those skilled in the art from the following Disclosure.

BRIEF DESCRIPTION OF THE DRAWINGS

FIG. 1A is an example functional illustration of resonant impedance sensing with controlled negative impedance, including a resonant sensor (represented by a resonator in parallel with a resonant impedance), and a sensor data converter that includes a negative impedance stage and a negative impedance control stage that establish a negative impedance control loop in which a controlled negative impedance is presented to the sensor to maintain steady-state oscillation, according to aspects of the invention.

FIG. 1B illustrates an example resonant sensor for inductive sensing based on an LC resonator, with resonant impedance represented (a) by a series resistance Rs, and (b) an equivalent circuit representation with parallel resistance Rp.

FIG. 1C illustrates a resonant sensor for inductive sensing based on an LC resonator, with parallel resistance Rp (impedance), coupled to a controlled negative resistance Rres, where Rres=−Rp corresponds to a steady-state oscillation, according to aspects of the invention.

DETAILED DESCRIPTION

Figure 2:
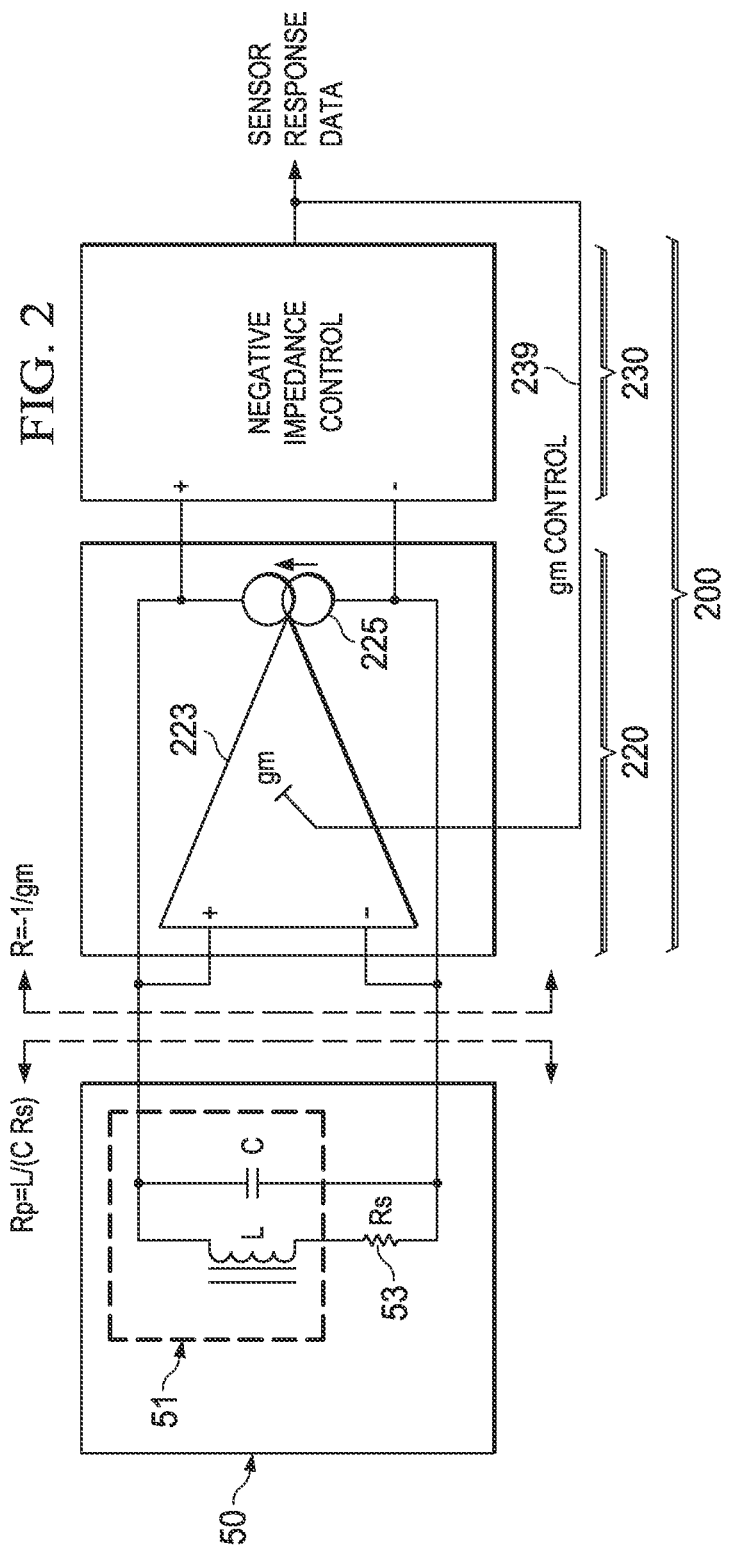
FIG. 2 illustrates an example functional embodiment of resonant impedance sensing with controlled negative impedance, using an inductive resonant sensor (LC resonator), coupled to a sensor data converter that includes a negative impedance stage and a negative impedance control stage, where the negative impedance stage is implemented by a trans-admittance amplifier with variable (controllable) trans-admittance (gm), and the impedance (admittance) control stage provides a gm control signal to modulate/tune gm (admittance), and thereby control negative impedance.

This Description and the Figures disclose example embodiments and implementations that illustrate various features and advantages of the invention, aspects of which are defined by the Claims. Known circuits, functions and operations are not described in detail to avoid unnecessarily obscuring the principles and features of the invention.

The Disclosure provided by this Description and the Figures is generally in the context of inductive sensing in which an inductive resonant sensor (LC resonator) is used in connection with conductive targets, such that the response of the resonant sensor to a target corresponds to a storage or loss in magnetic flux energy output from the inductive resonant sensor. The invention is not limited in applicability to inductive sensing, but rather is applicable to resonant impedance sensing in general (including, for example, capacitive and mechanical resonant impedance sensing).

FIG. 1A is an example functional illustration of resonant impedance sensing with controlled negative impedance. A resonant impedance sensing system 10 includes a resonant sensor 50 and a sensor data converter 100.

Resonant sensor 50 includes a resonator 51_that_can be characterized by a resonant impedance 53 and a resonance state which is characterized by resonator oscillation amplitude and frequency. Resonant sensor 50 can be operated in a resonance state corresponding to steady-state oscillation by injecting energy into resonator 51 sufficient to overcome the losses of resonant impedance 53.

The presence of (interaction with) a target is reflected in changes in sensor/resonant impedance and frequency, causing changes in resonance state. In accordance with aspects of the invention, the response of the resonant sensor 50 (resonator 51) to a target is captured and converted to sensor response data by presenting to the resonant sensor a controlled negative impedance required to maintain resonator 51 at steady-state oscillation. That is, the sensor response data quantifies the negative impedance required to maintain steady-state oscillation. This sensor response data can be provided, for example, to a processor or controller for detection, measurement or other processing.

FIG. 1B illustrates an example resonant sensor 50 for inductive sensing based on an LC resonator 51 formed by an inductor sensing coil and parallel capacitor, with resonant impedance 53 represented by series resistance Rs. Also illustrated is an equivalent LC resonator 51 circuit with parallel impedance 53 represented by resistance Rp, where Rp=L/(C Rs). In this Description and the Figures, Rs and Rp are used interchangeably according to Rp=L/(C Rs).

FIG. 1C illustrates a resonant sensor 50 with an LC resonator 51 and a parallel resonant impedance 53 represented by resistance Rp. In accordance with aspects of the invention, a sensor data converter 100 presents a controlled negative impedance 55 to the resonant sensor represented by a sensor resistance Rres, establishing the condition for steady-state oscillation as Rres=−Rp such that the sensor resistance Rp is canceled.

Referring to FIGS. 1A and 1C, sensor data converter 100 is configured to convert/capture the response of resonant sensor 50 to a target. The sensor data converter 100 implements resonant impedance sensing according to aspects of the invention by presenting a controlled negative impedance 55 to resonant sensor 50, substantially canceling resonant impedance 53 to maintain a resonance state corresponding to steady-state oscillation. As a result, the controlled negative impedance required to maintain steady-state oscillation, can be quantified as sensor response data. The sensor data converter can be configured to present the controlled negative impedance either in parallel with resonant impedance, as illustrated in FIG. 1A, or in series with resonant impedance.

Sensor data converter 100 is coupled to the resonant sensor 50. Converter 100 includes a negative impedance stage 120 followed by a negative impedance control stage 130. The negative impedance stage 120 is configured to present to the resonant sensor a negative impedance that is controlled in response to changes in resonance state (resonator oscillation amplitude and frequency) resulting from the presence of or interaction with a sensed target.

The resonant impedance sensing system 10 can be configured/optimized for operation at a specified resonator frequency by connecting additional reactive components to the resonant sensor (resonator 51), for example, a capacitor in parallel or in series, or an inductor in parallel or in series, or a combination of both. This system configuration can enable the sensor data converter 100 to be designed/configured independent of the design/configuration of the resonant sensor 50. The resonant impedance sensing system 10 can then be configured/optimized for an existing resonant sensor 50 by incorporating additional reactive component(s), and then coupling the sensor data converter to the resonant sensor with added reactive component(s) used to adjust resonant impedance and frequency range.

Negative impedance stage 120 and negative impedance control stage 130 establish a negative impedance control loop that controls the negative impedance 55 presented by the sensor data converter 100 to the resonant sensor 50. In response to a target, the resonant impedance 53 changes, resulting in a corresponding change in resonance state. According to aspects of the invention, the negative impedance control loop responds by controlling the negative impedance presented by the negative impedance stage 123 to substantially cancel resonant impedance, and maintain a resonance state corresponding to steady-state oscillation. A change in resonant impedance 53 (resonance state) is represented as a change in the output 121 of the negative impedance stage 120.

In response, the negative impedance control stage 130 generates a negative impedance control signal 139 to control the negative impedance presented by the negative impedance stage 130 so as to maintain steady-state oscillation. This negative impedance control signal corresponds to sensor response data quantifying the controlled negative impedance required to maintain steady-state oscillation, and representing the response of the sensor to the target.

Typically the bandwidth of the negative impedance control loop will be substantially lower than the resonance frequency. The closed impedance control loop enables control of any non-zero resonance state and maintains a constant oscillation amplitude, which is advantageous for low voltage applications.

For the example functional embodiment in FIG. 1A, the negative impedance control loop is illustrated as controlling resonator oscillation amplitude. Specifically, sensor data converter 100 can be configured to control the negative impedance 55 presented to the resonant sensor 50 based on changes in resonator oscillation amplitude. That is, a change in resonance state of resonator 51 caused by a change in resonant impedance 53 in response to a target is reflected in a change in resonator oscillation amplitude.

Sensor data converter 100 and the negative impedance control loop operate to detect changes in resonator oscillation amplitude (resonance state) as a measure of the change in resonant impedance. The negative impedance stage 120 is controlled in response to the changes in resonator oscillation amplitude to adjust the negative impedance 55 presented to the resonator 51, and thereby adjust resonator oscillation amplitude to maintain steady-state oscillation.

The negative impedance control stage 130 can be functionally implemented as a resonator amplitude detection and control block 131 that includes resonator amplitude detection 133 and negative impedance control 135. Resonator amplitude detection 133 detects resonator oscillation amplitude which is represented as the output 121 of the negative impedance stage 120. Negative impedance control 135 generates negative impedance control signal 139 based on a difference between (a) resonator oscillation amplitude as detected by resonator amplitude detection 133, and (b) a reference amplitude signal corresponding to a resonator oscillation amplitude at steady-state oscillation.

The output of the resonator amplitude detection and control block 131 provides the negative impedance control signal 139 looped back to negative impedance stage 120 to control the negative impedance, which corresponds to the sensor data output by the sensor converter 100. Specifically, negative impedance is controlled to substantially cancel resonant impedance as it changes in response to a target, thereby maintaining resonator oscillation amplitude substantially constant to achieve a resonance state corresponding to steady-state oscillation. As a result, the controlled negative impedance associated with steady-state oscillation is quantified as sensor response data that represents to the response of the sensor to the target.

Thus, resonant impedance sensing according to aspects of the invention includes: (a) generating a controlled negative impedance which is presented to the sensor; (b) controlling the negative impedance based on a detected resonance state to substantially cancel the sensor resonant impedance, such that the sensor resonance state corresponds to steady-state oscillation, where the negative impedance is controlled with a negative impedance control loop that includes the sensor resonator as a loop filter; and (c) providing sensor response data based on the controlled negative impedance, such that the sensor response data represents a response of the sensor to the target.

FIG. 2 illustrates an example functional embodiment of resonant impedance sensing in connection with an resonant sensor 50 configured for inductive sensing with an LC resonator 51 and a resonant impedance 53 represented by series resistance Rs. A sensor data converter 200 coupled to resonant sensor 50 includes a negative impedance stage 220 and a negative impedance control stage 230.

The negative impedance stage 220 is functionally implemented with a trans-admittance amplifier 223 controlling a current source 225 that provides excitation current drive to the resonant sensor (resonator 51). Trans-admittance amplifier 223 is implemented with variable (continuous) controllable gm, and with a positive feedback loop to create negative impedance/resistance. Impedance control stage 230 is configured to provide the negative impedance control signal 239 as a gm control signal that modulates (tunes) trans-admittance gm, thereby controlling negative impedance in the manner described above in connection with FIG. 1A. The gm control signal corresponds to sensor response data that represents the sensor response captured/converted by the sensor data converter 200. In an alternative functional implementation, the negative impedance stage 220 can be implemented with a trans-admittance amplifier with constant gm, and a variable controllable current source controlled by the negative impedance control signal (positive feedback).

Figure 3:
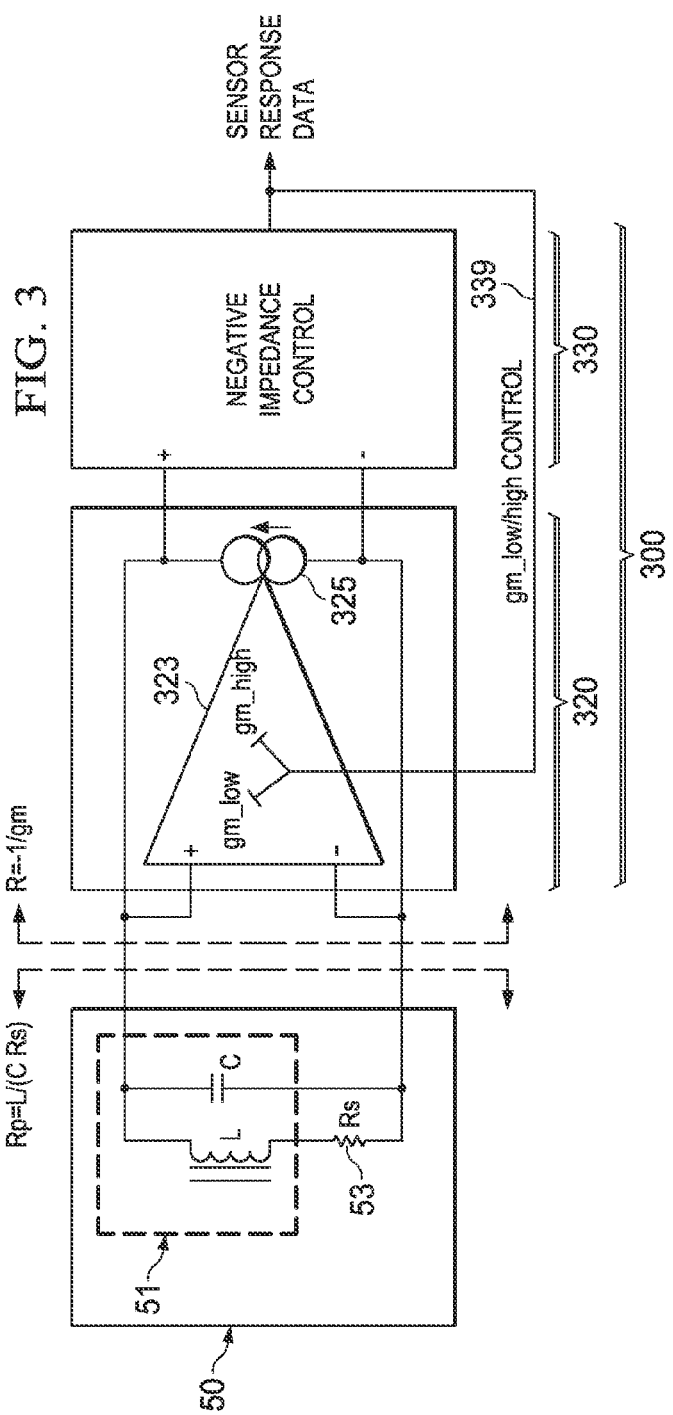
FIG. 3 illustrates an example functional embodiment of resonant impedance sensing with controlled negative impedance using an inductive resonant sensor (LC resonator) coupled to a sensor data converter that includes a negative impedance stage and a negative impedance control stage, where the negative impedance stage is implemented by a trans-admittance amplifier configured to switch between two discrete trans-admittance levels (such as gm_low/high), and the negative impedance control stage is configured to provide a corresponding gm_low/high control signal.

FIG. 3 illustrates an example functional embodiment of resonant impedance sensing in connection with an LC resonant sensor including an LC resonator 51 and a resonant impedance 53 represented by series resistance Rs. A sensor data converter 300 coupled to resonant sensor 50 includes a negative impedance stage 320 and a negative impedance control stage 330.

The negative impedance stage 320 is implemented with a trans-admittance amplifier 323 and a current source 325 that provides excitation current drive to the resonant sensor (resonator 51). Trans-admittance amplifier 323 is configured to switch between two discrete trans-admittance levels (gm_low and gm_high), and with a positive feedback loop to create negative impedance. Impedance control stage 330 is configured to provide the negative impedance control signal 339 as a gm_low/high control signal that modulates (tunes) transadmittance gm by switching between trans-admittance levels, thereby controlling negative impedance in the manner described above in connection with FIG. 1A. In this example embodiment, the time average of the gm_low/high control signal constitutes sensor response data that represents the sensor response captured/converted by sensor data converter 300 (quantifying the controlled negative impedance required to maintain steady-state oscillation).

For this example embodiment, in which negative impedance stage 320 is implemented as a two-level (gm_low/high) trans-admittance amplifier, and in which the negative impedance control loop is based on resonator oscillation amplitude as described in connection with FIG. 1A, the design objective is to measure changes resonator oscillation amplitude (resonance state), as a measure of changes in resonator resistance (impedance) $Rp=L/(C\ Rs)$, which result from sensor/target interaction. The methodology for controlling negative impedance (resistance) is to tune gm according to $gm*Rs=1$, so that $-1/gm$ represents the negative resistance (impedance) required to maintain resonator oscillation amplitude substantially constant at steady-state oscillation: (a) when gm=gm_high, resonator oscillation amplitude increases, and (b) when gm=gm_low, resonator oscillation amplitude decreases, such that (c) at steady-state oscillation, gm is effectively equal to 1/Rp and resonator oscillation amplitude is substantially constant (noting that typically negative impedance control loop bandwidth will be substantially less than the resonance frequency). That is, for this example embodiment, the negative impedance (resonator oscillation amplitude) control loop switches between discrete gm_low/high to keep resonator oscillation amplitude substantially constant at steady-state oscillation.

In an alternative functional implementation, the negative impedance stage 320 can be implemented with a trans-admittance amplifier with constant gm, and a discrete excitation current source that provides two or more discrete current drive levels, with switching between the discrete current drive levels controlled by the negative impedance control signal (positive feedback). Example embodiments in which controlled negative impedance is implemented based on discrete current drive are described in connection with FIGS. 5 and 6.

The discrete gm control signal 339 can be translated into a digital sensor read-out corresponding to sensor response, such as by digital filtering of the discrete gm_low/high control bit stream. That is, the negative impedance control loop is based on generating a predetermined number of discrete negative impedances applied sequentially in time, based on a negative impedance (gm_low/high) control signal 139, such that sensor response data corresponds to the time average negative impedance presented to the resonant sensor 50.

For the example embodiment in FIG. 3, discrete gm control is illustrated with two levels of gm control, gm_low/high, in contrast to the variable gm control in the embodiment illustrated in FIG. 2. By design modification, discrete gm control can be implemented with a number of levels greater than two, for example to increase accuracy and reduce quantization noise.

Figure 4:
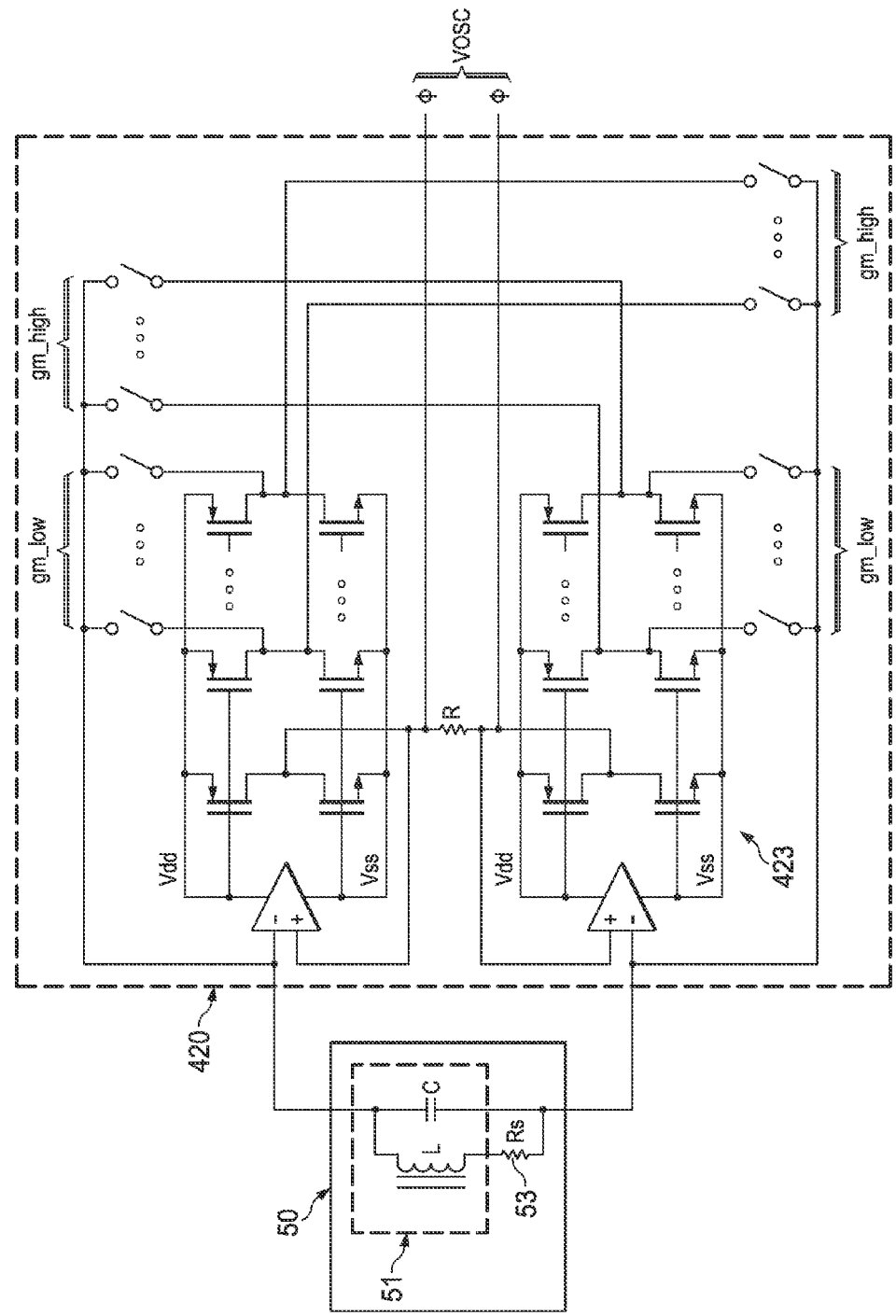
FIG. 4 illustrates an example embodiment of resonant impedance sensing with controlled negative impedance in which the negative impedance stage is implemented with a trans-admittance amplifier based on a Class A or AB amplifier configuration.

FIG. 4 illustrates an example embodiment of a negative impedance stage 420 implemented as a trans-admittance amplifier 423 based on a linear Class A or AB amplifier configuration. Trans-admittance amplifier 423 includes discrete gm_low/high control. An advantage of the Class A or AB implementation for a negative impedance stage is its high linearity, avoiding generation of higher harmonics. A design consideration in implementing a negative impedance stage with a linear amplifier is power consumption, given that the amplifiers used in trans-admittance amplifier 423 must have a bandwidth substantially higher than the resonant frequency.

Figure 5:
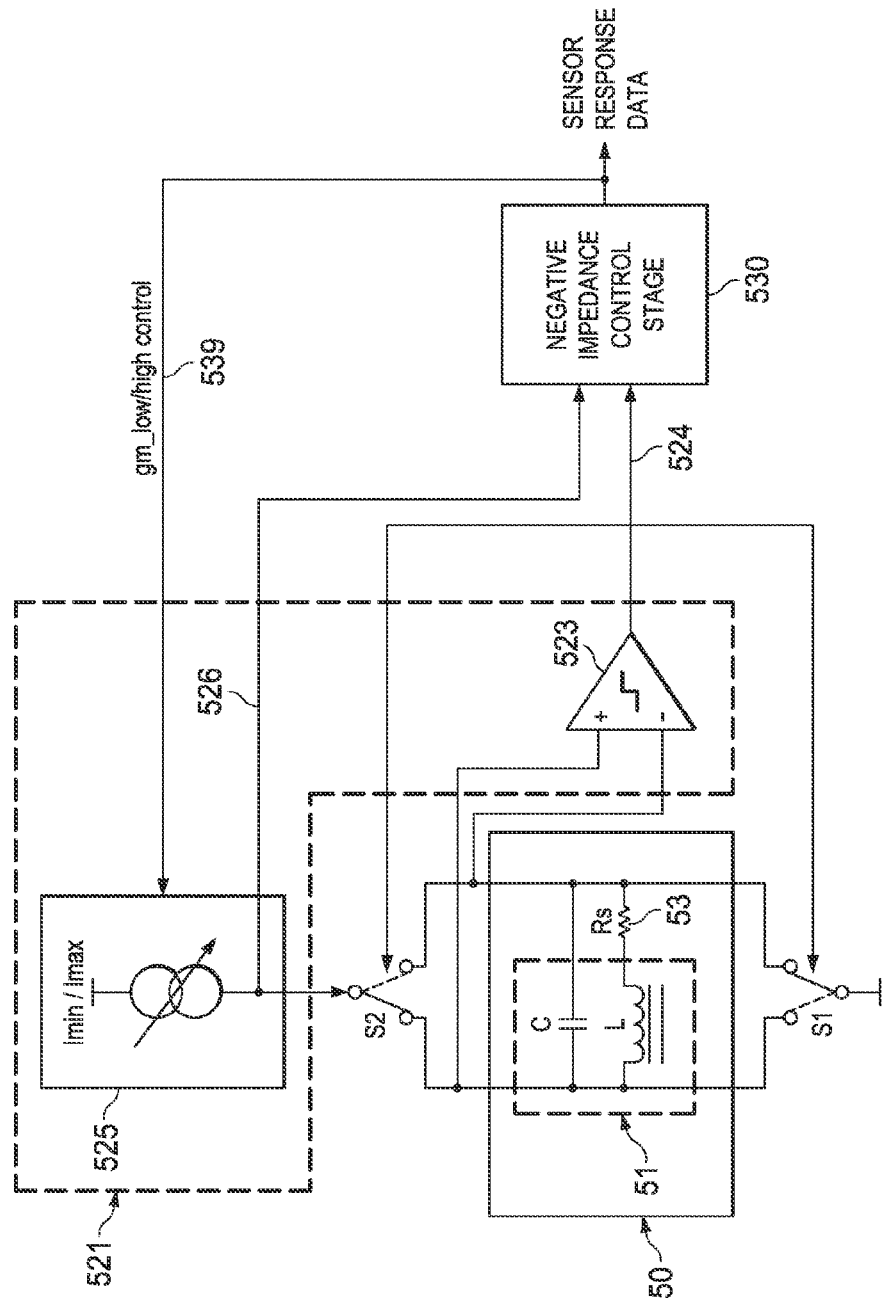
FIG. 5 illustrates an example embodiment of resonant impedance sensing with controlled negative impedance in which the negative impedance stage is implemented with a trans-admittance amplifier based on a Class D amplifier configuration interfaced to the resonant sensor with a ground-referenced H-Bridge.

FIG. 5 illustrates an example functional embodiment of a sensor data converter 500 including a negative impedance stage 520 and a negative impedance control stage 530. Negative impedance stage 520 is implemented as a Class D trans-admittance amplifier 521 interfaced to the resonant sensor 50 by a ground-referenced H-bridge S1/S2. The Class D trans-admittance amplifier 521 includes a comparator 523, and a current source 525 providing current drive to resonant sensor 50 (resonator 51).

For this example embodiment, current source 525 provides discrete (Imin/Imax) excitation current drive through the ground-referenced H-bridge S1/S2, with switching between discrete current drive levels (Imin/Imax) controlled by a discrete gm_low/high control signal 539 from the negative impedance control stage 530. Comparator 523 commutates the H-bridge, connecting the positive side of sensor resonator 51 to the excitation current source 525, and the negative side of the resonator 51 to ground. As resonator 51 changes polarity, the comparator correspondingly changes the states of S1/S2 of the H-bridge to maintain the positive side of resonator 51 as the noninverting input to comparator 323 (positive feedback), with the inverting input at ground.

The time average of the current pulse output of discrete current source 525 corresponds to the resonator oscillation amplitude output from resonator 51 as applied to the inputs (inverting/noninverting) to the comparator 523. When current source 525 outputs Imax current drive, resonator oscillation amplitude increases, and when current source 525 outputs current drive Imin, resonator oscillation amplitude decreases.

Thus, controlling resonator polarity controls the positive feedback (noninverting input to the comparator 523) that results in a controlled negative impedance being presented to resonator 51. This controlled negative impedance counters the resonant impedance 53 (Rs) to maintain steady-state oscillation. Basically, Imin/Imax represent the gain of the Class D trans-admittance amplifier.

Advantages of a Class D amplifier implementation for the trans-admittance amplifier include low power Class D operation. Advantages of the ground-referenced H-bridge driver include saving power by eliminating active common mode regulation.

Figure 6:
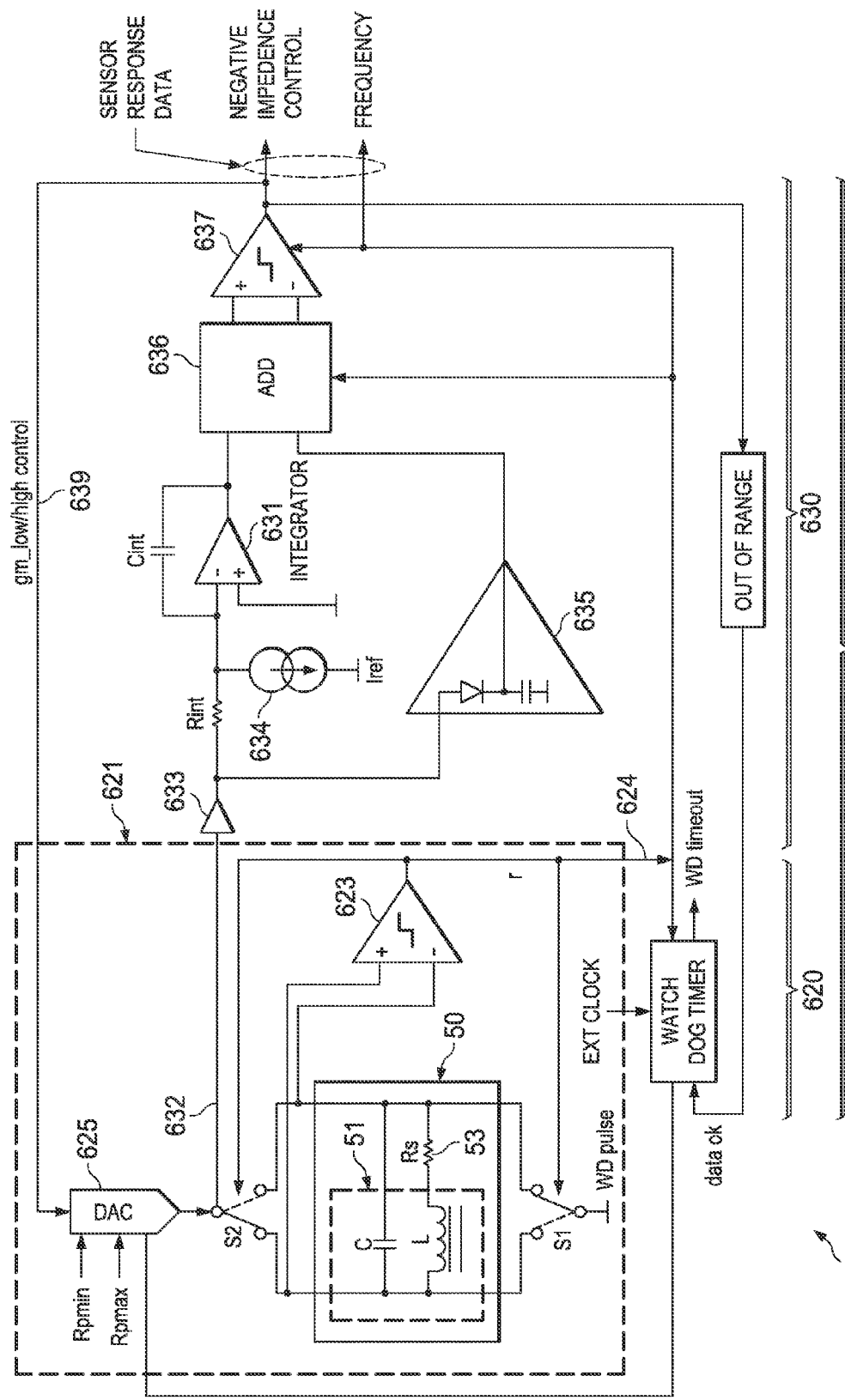
FIG. 6 illustrates an example embodiment of resonant sensor system with controlled negative impedance, including an inductance-to-digital converter (LDC) implemented with a Class D negative impedance stage based on a ground-referenced H-bridge Class D trans-admittance amplifier.

FIG. 6 illustrates an example embodiment of a resonant sensor system 60 configured for inductive sensing, including an LC resonant sensor 50 interfaced to an inductance-to-digital converter (LDC) 600. The LC resonant sensor includes an LC resonator 51 and a resonant impedance 53 represented by Rs.

LDC 600 implements resonant impedance sensing with controlled negative impedance, capturing/converting the response of resonant sensor 50 to a target as sensor response data. LDC 600 includes a negative impedance stage 620 and a negative impedance control stage 630. As described in connection with FIG. 1A, the negative impedance stage 620, negative impedance control stage 630 and a negative impedance control signal 639 establish a negative impedance control loop that controls the negative impedance presented to the resonant sensor 50 (resonator 51). This negative impedance control loop includes the resonant sensor 50 (resonator 51).

LDC 600 detects the changes in resonant impedance (Rs) resulting from target interaction as changes in resonance state (resonator oscillation amplitude), and effects resonant impedance sensing by controlling the negative impedance presented to the resonant sensor to counteract changes in resonator oscillation amplitude and maintain steady-state oscillation. That is, the controlled negative impedance substantially cancels resonant impedance 53, maintaining a resonance state (resonator oscillation amplitude and resonance frequency) corresponding to steady-state oscillation. The controlled negative impedance that counteracts resonant impedance to maintain steady-state oscillation is quantified as sensor response data that corresponds to the sensor response to the target.

LDC 600 is configured to detect changes in the resonator oscillation amplitude component of the resonance state caused by the interaction of resonant sensor 50 with a target. Negative impedance stage 620 is implemented as a_Class D H-bridge (ground referenced) amplifier configuration._Class D trans-admittance amplifier 621 that includes comparator 623 and discrete DAC current drive 625. The Class D trans-admittance amplifier 621 and the negative impedance control loop are configured to present to sensor 50 a negative resistance −Rp=−L/(C Rs) that is controlled to substantially cancel the sensor resistance (impedance) Rs, maintaining resonator oscillation amplitude (resonance state) at steady-state oscillation by counteracting changes in resonator oscillation amplitude resulting from target interaction.

Referring also to FIG. 5 and the associated description, the Class D trans-admittance amplifier 621, including discrete current source DAC 623, is controlled to provide discrete Imin/Imax excitation current drive to the LC resonator 51. DAC current source 625 provides, in response to the discrete gm_low/high control signal 639 from a quantizer 637 in the negative impedance control stage 630, discrete (Imin/Imax) excitation current drive through the ground-referenced H-bridge S1/S2. Comparator 623 commutates the H-bridge to provide positive feedback, connecting the positive side of the sensor resonator 51 to the DAC current source 625, and the negative side of the resonator 51 to ground.

The discrete Imax/Imin current drive from the DAC current source 625 is time averaged by the resonant sensor 50, which acts as a loop filter in the negative impedance control loop. That is, the time average of the current pulse output of the DAC current source 625 corresponds to the resonator oscillation amplitude of the output from resonator 51 as applied to the inputs (inverting/noninverting) to the comparator 623.

RPmin and Rpmax can be used to specify a range of operation for resonant sensor 50. As an example design modification, quantization of gm control can be increased to more than two levels with a corresponding increase in quantization of the gm control signal 639.

Resonant sensor 50 is included in the negative impedance control loop at a summing node, where the positive resonant impedance of the sensor is compared with the negative impedance of the control loop of the LDC 600. Advantages of this configuration include: (a) enables a direct measurement of resonant impedance rather than measuring a parameter correlated to it; (b) nonlinearity from a magnetic core is substantially eliminated, since, for example, a constant resonator oscillation amplitude of the sensor implies a constant amplitude of the magnetic flux generated by the sensor; (c) transient response of the LDC can be optimized for the sensor, since the transient response of the control loop tracks the transient response of the sensor; and (d) quantization noise from the LDC (Class D) is attenuated by the sensor.

Class D amplifier 621 can be implemented by a Class D OTA (operational transconductance amplifier), with a ground-referenced H-bridge input interface. Implementing the negative impedance stage as a trans-admittance amplifier allows negative impedance to be defined by resistors, which have a low temperature coefficient relative to transistors, thereby mitigating temperature drift.

Negative impedance control stage 630 is implemented with an integrator 631 including the integrating Rint/Cint. Integrator 631 provides additional filtering for the resonator current drive supplied by the DAC current source 625. This additional filtering is a design choice, but is advantageous for reducing quantization noise.

Resonator oscillation amplitude_voltage 632 is input to the negative impedance control stage 630, and integrator 631, through a buffer 633 to avoid loading resonator 51. This detected resonator oscillation amplitude voltage is converted to a current by Rint, and subtracted by a reference current 633 (corresponding to Vref in FIG. 1A). The resulting resonator oscillation amplitude current is integrated by the integrator 631 and Rint/Cint.

A stability control circuit 635 is included to enhance stability by configuring a zero from the resonant amplitude voltage input to the integrator, which is used to compensate for the poles introduced by the resonant sensor capacitor and the integration capacitor Cint.

The integration output from integrator 631 is summed 636 with the feed forward output of stability control circuit 635, and the result quantized by quantizer 637 as the gm_low/high (impedance) control signal 639. The quantized gm_low/high control signal is input to the DAC current drive 625 to generate the excitation currents Imin/Imax injected into resonant sensor 50.

Quantizer 637 outputs the discrete gm_low/high control signal 639. Quantizer 637 is implemented as a comparator, with comparator output levels corresponding to the gm_low/high admittance levels for which trans-admittance amplifier 621 is configured, i.e. for the Imin/Imax injected resonator current.

The impedance (gm_low/high) control signal 639 output from quantizer 637 is generated by the negative impedance control stage 630 based on detected resonator oscillation amplitude, such that the controlled negative impedance of the negative impedance stage 620 substantially cancels the resonant impedance (Rp) 53 of the resonant sensor 50, and maintains the output resonator oscillation amplitude substantially constant. As a result, the impedance control signal 639 corresponds to the response of resonant sensor 50 to a target in that it represents the negative impedance required to maintain resonator oscillation amplitude substantially constant (steady-state oscillation amplitude).

The output 624 of comparator 623 in the Class D trans-impedance amplifier 621, which is used to commutate the H-bridge S1/S2, corresponds to resonator frequency (resonance frequency at steady-state oscillation). That is, the comparator output 624 provides measurement (open loop) of resonator frequency. And, as noted above, the resonance state of a sensor resonator is characterized by resonator oscillation amplitude and frequency.

The controlled negative impedance required to maintain resonance state at steady-state oscillation, which is derived from changes in resonator oscillation amplitude resulting from sensor/target interaction, corresponds to sensor response data available from LDC 600 as an output of the negative impedance control loop. That is, the negative impedance control signal 639 that controls the negative impedance presented to the resonant sensor by the negative impedance stage 620 constitutes sensor response data that quantifies the controlled negative impedance.

Resonance frequency 624 provides additional sensor response data that can be used in processing and determining resonant sensor response (for example, performing temperature compensation).

Applications for embodiments of resonant impedance sensing according to the invention can include: (a) axial position sensing in which the response of the sensor to the target corresponds to an axial position and/or orientation of the target relative to the sensor; (b) lateral position sensing in which the sensor response depends on a fraction of target area that is exposed to the magnetic flux generated by the sensor; and (c) magnetic impedance modulation in which sensor response is based on modulation of magnetic impedance of a magnetic circuit.

Advantages of resonant impedance sensing according to the invention include: (a) accuracy—because the sensor/resonator resonant impedance is measured directly, rather than a parameter correlated to it, higher accuracy is achieved; (b) temperature independence—because the matching negative impedance is temperature independent, only drift of the resonant sensor remains; and (c) integration in high density CMOS—the sensor/resonator impedance sensing methodology can be applied using a low constant resonance amplitude, enabling implementation in high density CMOS, and allowing for advanced signal processing, and temperature correction of the resonant sensor, which is particularly advantageous for inductive (eddy current) sensing applications.

Figure 7A:
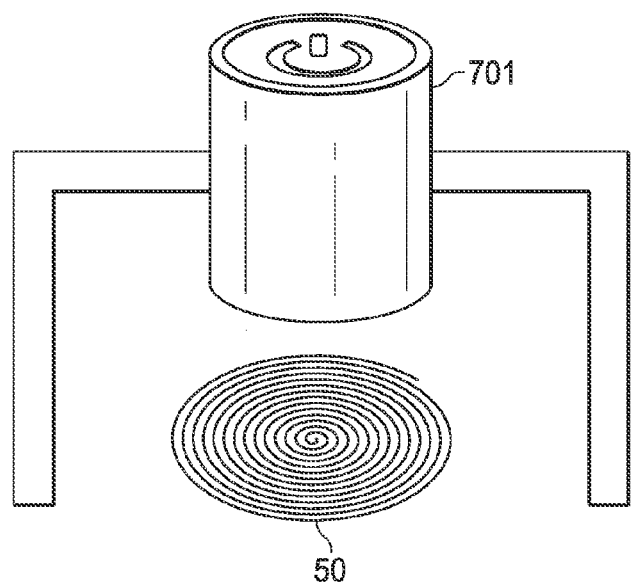
FIGS. 7A and 7B illustrate example applications for resonant impedance sensing according to aspects of the invention, including (7A) axial position sensing in which the response of the sensor to the target corresponds to an axial (z axis) position and/or orientation of the sensor relative to the target, and (7B) lateral position sensing in which the sensor response corresponds to a relative lateral (xy) position of the sensor and a target, and depends on a fraction of target area that is exposed to the magnetic flux generated by the sensor.
Figure 7B:
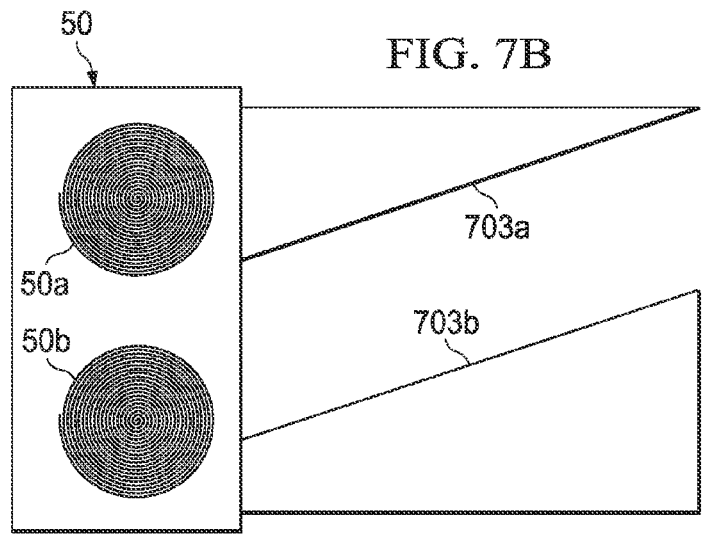

FIGS. 7A and 7B illustrate example applications for resonant impedance sensing according to aspects of the claimed invention. FIG. 7A illustrates an example resonant impedance sensing application in which the response of a resonant sensor 50 to a target 701 is based on an axial (z axis) position of the sensor relative to the target. FIG. 7B illustrates an example resonant impedance sensing application in which the response of a resonant sensor 50 with one or more sensors (coils) 50a and 50b to one or more respective targets 703a and 703b is based on a lateral (xy axis) position of a resonant sensor relative to a respective target. In each application, the response of the resonant sensor to the target can be captured/converted by a sensor-to-data converter (such as LDC 600 in illustrated in FIG. 6) as sensor response data that corresponds to the controlled negative impedance generated by the converter, and therefore represents sensor response to the target.

The Disclosure provided by this Description and the Figures sets forth example embodiments and implementations, including associated operations and methods, that illustrate various aspects and features of the invention. This Disclosure can be used by those skilled in the art as a basis for design modifications, substitutions and alternatives to construct other embodiments, including adaptations for other applications. Accordingly, this Disclosure does not limit the scope of the invention, which is defined by the Claims.

The invention claimed is:

1. A circuit operable to capture the response of a resonant sensor to a target where the resonant sensor includes a resonator characterized by a resonant impedance loss factor, and a resonance state (resonator oscillation amplitude and resonator oscillation frequency), including a resonance state corresponding to steady-state oscillation, comprising:
    class D negative impedance circuitry configured to drive current into the resonator with a negative impedance, including
        a comparator configured to receive a resonator oscillation voltage, and to provide a class D switching output with a frequency synchronized to the resonator oscillation frequency;
        current drive circuitry configured to output a drive current based on a loop control signal corresponding to a controlled negative impedance magnitude; and
        H-bridge circuitry configured to interface the drive current source to the resonator;
        the comparator class D switching output controlling the H-bridge circuitry to maintain positive feedback, such that the resonator is driven with the negative impedance; and
    loop control circuitry configured to generate the loop control signal based on a detected sensor resonance state, such that a time average of the drive current corresponds to a magnitude of the controlled negative impedance that substantially cancels the sensor resonator losses to maintain steady-state oscillation;
    thereby establishing a negative impedance control loop that includes the sensor resonator as a loop filter, and that controls negative impedance, such that the loop control signal corresponds to sensor response data that represents the response of the sensor to the target.

2. The circuit of claim 1, wherein the detected resonance state corresponds to resonator oscillation amplitude, and wherein the negative impedance control loop is configured control negative impedance at least in part by controlling resonator oscillation amplitude.

3. The circuit of claim 2, wherein the loop control circuitry is configured to provide the loop control signal based on the difference in resonator oscillation amplitude relative to a reference amplitude signal corresponding to steady-state oscillation.

4. The circuit of claim 1,
    wherein the current drive circuitry comprises multi-level current drive circuitry configured to supply at least two levels of current drive to the sensor resonator; and
    wherein the loop control circuitry controls switching between the current drive levels.

5. A system operable to capture the response of a resonant sensor to a target, comprising:
    a resonant sensor including a resonator characterized by a resonant impedance loss factor, and a resonance state (resonator oscillation amplitude and resonator oscillation frequency), including a resonance state corresponding to steady-state oscillation;
    an inductance-to-data converter circuit coupled to the sensor resonator, and configured to convert a response of the sensor to the target into sensor response data, including
        class D negative impedance circuitry configured to drive current into the resonator with a negative impedance, including
            a comparator configured to receive a resonator oscillation voltage, and to provide a class D switching output with a frequency synchronized to the resonator oscillation frequency;
            current drive circuitry configured to output a drive current based on a loop control signal corresponding to a controlled negative impedance magnitude; and
            H-bridge circuitry configured to interface the drive current source to the resonator;
            the comparator class D switching output controlling the H-bridge circuitry to maintain positive feedback, such that the resonator is driven with the negative impedance; and
        loop control circuitry configured to generate the loop control signal based on a detected sensor resonance state, such that a time average of the drive current corresponds to a magnitude of the controlled negative impedance that substantially cancels the sensor resonator losses to maintain steady-state oscillation;
        thereby establishing a negative impedance control loop that includes the sensor resonator as a loop filter, and that controls negative impedance, such that the loop control signal corresponds to sensor response data that represents the response of the sensor to the target.

6. The system of claim 5, wherein the detected resonance state corresponds to resonator oscillation amplitude, and wherein the negative impedance control loop is configured control negative impedance at least in part by controlling resonator oscillation amplitude.

7. The system of claim 6, wherein the loop control circuitry is configured to provide the loop control signal based on the difference in resonator oscillation amplitude relative to a reference amplitude signal corresponding to steady-state oscillation.

8. The system of claim 5,
    wherein the current drive circuitry comprises multi-level current drive circuitry configured to supply at least two levels of current drive to the sensor resonator; and
    wherein the loop control circuitry controls switching between the current drive levels.

9. A method useable in capturing the response of a resonant sensor to a target where the resonant sensor includes a resonator characterized by a resonant impedance loss factor, and a resonance state (resonator oscillation amplitude and resonator oscillation frequency), including a resonance state corresponding to steady-state oscillation, comprising:

generating a controlled negative impedance which is presented to the sensor with a Class D H-bridge amplifier that includes:

a comparator configured to receive a resonator oscillation voltage, and to provide a class D switching output with a frequency synchronized to the resonator oscillation frequency;

current drive circuitry configured to output a drive current based on a loop control signal corresponding to a controlled negative impedance magnitude; and H-bridge circuitry configured to interface the drive current source to the resonator;

the class D switching output controlling the H-bridge to maintain positive feedback, such that the resonator is driven with the negative impedance; and generating the loop control signal to control negative impedance based on a detected resonance state, such that a time average of the drive current corresponds to a magnitude of the controlled negative impedance that substantially cancels the sensor resonator losses to maintain steady-state oscillation;

thereby establishing a negative impedance control loop that includes the sensor resonator as a loop filter; and providing sensor response data based on the controlled negative impedance, such that the sensor response data corresponds to a response of the sensor to the target.

10. The method of claim 9, wherein the detected resonance state corresponds to resonator oscillation amplitude, and wherein the negative impedance control loop is configured control negative impedance at least in part by controlling resonator oscillation amplitude relative to steady-state oscillation.

11. The method of claim 9, wherein the current drive circuitry comprises multi-level current drive circuitry configured to supply at least two levels of current drive to the sensor resonator; and wherein generating the loop control signal comprises generating a multi-level loop control signal to control switching between the current drive levels.

* * * * *